(12) United States Patent
Wang et al.

(10) Patent No.: US 12,072,767 B2
(45) Date of Patent: Aug. 27, 2024

(54) ERROR INFORMATION STORAGE FOR BOOT-UP PROCEDURES

(71) Applicant: Micron Technology, Inc., Boise, ID (US)

(72) Inventors: Jun Wang, Shanghai (CN); De Hua Guo, Shanghai (CN); Jia Ling Pan, Shanghai (CN); Kui Ding, Shanghai (CN); Kun Liu, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/758,333

(22) PCT Filed: Mar. 17, 2022

(86) PCT No.: PCT/CN2022/081446
§ 371 (c)(1),
(2) Date: Jul. 1, 2022

(87) PCT Pub. No.: WO2023/173362
PCT Pub. Date: Sep. 21, 2023

(65) Prior Publication Data
US 2024/0193042 A1   Jun. 13, 2024

(51) Int. Cl.
*G06F 11/14*   (2006.01)
*G06F 9/4401*  (2018.01)

(52) U.S. Cl.
CPC ........ *G06F 11/1417* (2013.01); *G06F 9/4403* (2013.01); *G06F 2201/805* (2013.01)

(58) Field of Classification Search
CPC .... G06F 9/4403; G06F 9/4401; G06F 9/4406; G06F 9/4408; G06F 9/44505;
(Continued)

(56) References Cited

U.S. PATENT DOCUMENTS

2008/0148038 A1*  6/2008  Abe .................... G06F 11/167
                                                    713/2
2009/0172467 A1   7/2009  Araki
(Continued)

FOREIGN PATENT DOCUMENTS

EP         2124151 A1    11/2009

OTHER PUBLICATIONS

"International Search Report and Written Opinion of the International Searching Authority," issued in connection with Int'l Appl. No. PCT/CN2022/081446, dated Dec. 14, 2022 (9 pages).

*Primary Examiner* — Raymond N Phan
(74) *Attorney, Agent, or Firm* — Holland & Hart LLP

(57) ABSTRACT

Methods, systems, and devices for error information storage for boot-up procedures are described. A memory system may detect an error associated with performing the boot-up procedure of the memory system and may store error information associated with the detected error in a persistent register at the memory system. In some cases, the memory system may additionally store the error information in a cache at the memory system. After storing the error information, the memory system may reset and, after resetting, may transfer the error information from the persistent register to a non-volatile memory device at the memory system. In cases that the memory system stores error information in the cache prior to the reset, the memory system may additionally transfer the error information from the cache to the non-volatile memory device.

25 Claims, 6 Drawing Sheets

(58) Field of Classification Search
CPC .............. G06F 9/44552; G06F 11/1417; G06F 11/1402; G06F 11/14; G06F 11/1514; G06F 11/142

See application file for complete search history.

(56) References Cited

U.S. PATENT DOCUMENTS

| | | | |
|---|---|---|---|
| 2013/0227356 A1* | 8/2013 | Kim | G06F 11/0766 714/48 |
| 2014/0223239 A1* | 8/2014 | Mittal | G06F 11/0787 714/42 |
| 2015/0113334 A1* | 4/2015 | Raj | G06F 11/079 714/45 |
| 2020/0042391 A1 | 2/2020 | Pepper et al. | |
| 2020/0218599 A1 | 7/2020 | Elliott et al. | |

* cited by examiner

ERROR INFORMATION STORAGE FOR BOOT-UP PROCEDURES

CROSS REFERENCE

The present Application for Patent is a 371 national phase filing of International Patent Application No. PCT/CN2022/081446 by Wang et al., entitled "ERROR INFORMATION STORAGE FOR BOOT-UP PROCEDURES," filed Mar. 17, 2022, assigned to the assignee hereof, and expressly incorporated by reference herein.

FIELD OF TECHNOLOGY

The following relates to one or more systems for memory, including error information storage for boot-up procedures.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Some memory systems may detect an error associated a stuck condition in which the memory system may be unable to transmit commands, receive command, or perform operations. In response to detecting the error associated with the stuck condition, the memory system may store error information indicating the type of detected error in a non-volatile memory device (e.g., a not-and (NAND) memory device) and perform a reset operation to exit the stuck condition. Here, the memory system or a user of the memory system may access the stored error information in the non-volatile memory device after resetting the memory system in order to perform one or more debugging operations after resetting the memory system to exit the stuck condition. In some cases, the memory system may detect an error associated with a stuck condition and be unable to store the error information in the non-volatile memory device prior to performing the reset operation. For example, the memory system may detect the error during a boot-up operation of the memory system. Here, the memory system may not have executed firmware associated with the non-volatile memory device prior to detecting the error and may thus, be unable to access the non-volatile memory device. In cases where the memory system does not store the error information in the non-volatile memory device prior to performing the reset operation, the memory system (or the user of the memory system) may be unable to perform a debugging operation after resetting the memory system.

Accordingly, the techniques described herein enable the memory system to store error information associated with stuck conditions even in cases that the memory system is unable to store the error information in the non-volatile memory device. For example, in response to detecting an error associated with a stuck condition, the memory system may store error information associated with the detected error in a persistent register (e.g., a sticky register) at the memory system. Here, the memory system may have access to the error information stored in the persistent register even after resetting the memory system. Additionally, the memory system may store the error information associated with the detected error in a cache at the memory system that maintains stored information during reset operations. In both cases, after resetting, the memory system may transfer the error information (e.g., from the persistent register, from the cache, from both the cache and the persistent register) to the non-volatile memory device after resetting the memory system. Then, the memory system (or the user of the memory system) may optionally perform a debugging operation using the error information stored in the persistent register and, in some cases additionally stored in the cache, during the reset operation.

Figure 1:
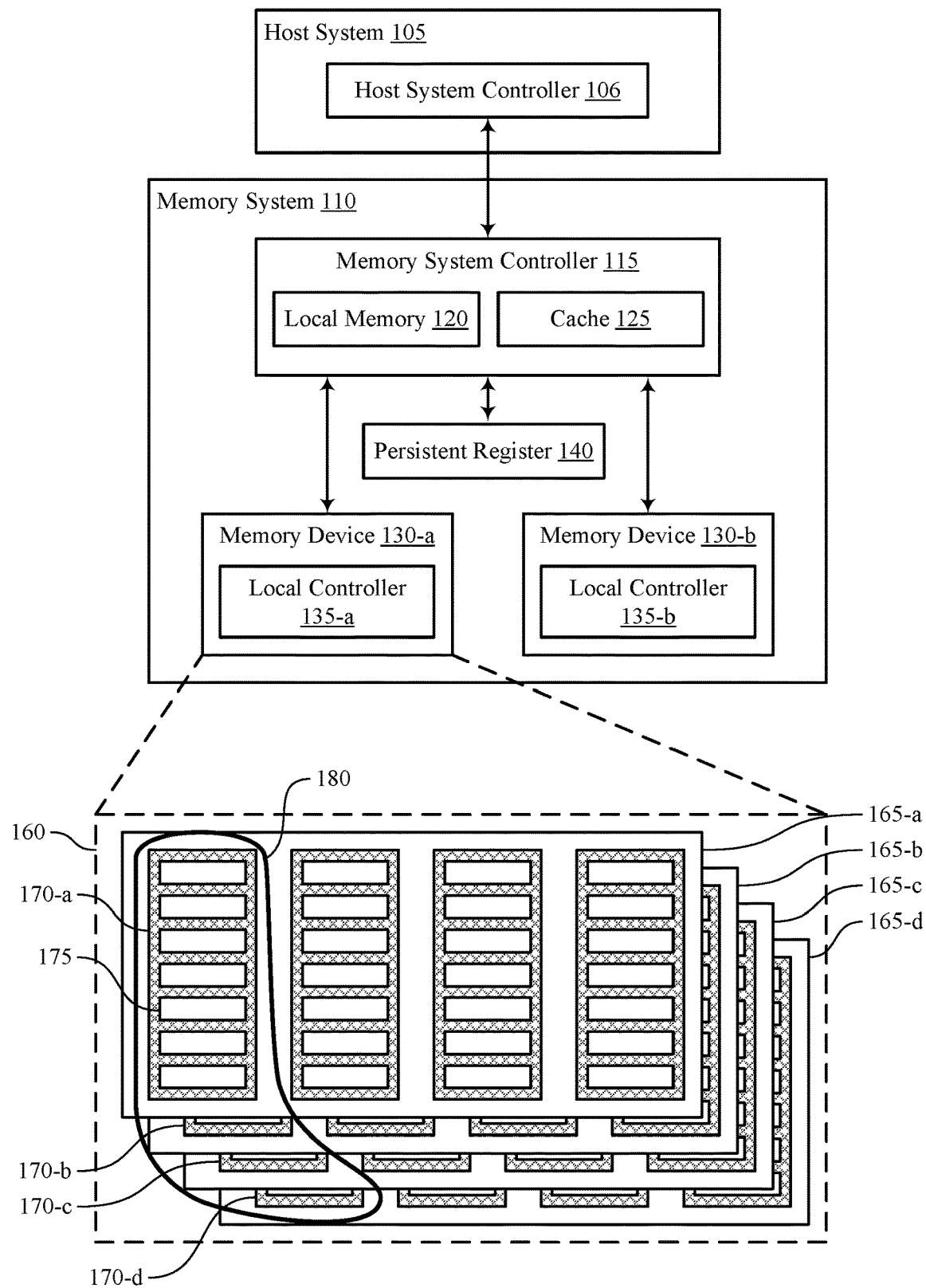
FIG. 1 illustrates an example of a system that supports error information storage for boot-up procedures in accordance with examples as disclosed herein.

Features of the disclosure are initially described in the context of a systems with reference to FIG. 1. Features of the disclosure are described in the context of process flows and a transferring procedure with reference to FIGS. 2-4. These and other features of the disclosure are further illustrated by and described in the context of an apparatus diagram and flowchart that relate to error information storage for boot-up procedures with reference to FIGS. 5 and 6.

FIG. 1 illustrates an example of a system 100 that supports error information storage for boot-up procedures in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IOT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-$a$ and 130-$b$ are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

The memory system controller 115 may additionally include a cache 125. In some cases, the cache 125 may be an example of the local memory 120 or may be included in the local memory 120. Additionally or alternatively, the memory system controller 115 may include the cache 125 separate from the local memory 120. In some cases, the cache 125 may include SRAM (e.g., 2 kilobytes of SRAM, 4 kilobytes of SRAM) and may maintain stored information such as error information during reset operations of the memory system 110.

A persistent register 140 may include one or more registers that maintain stored information during reset operations of the memory system 110. For example, the persistent register 140 may include four 32-bit registers. In some cases, the persistent register 140 may receive power even during reset operations of the memory system 110. In some other cases, the persistent register 140 may include memory that maintains stored information even in cases that the persistent register 140 does not receive power (e.g., such as during a reset operation).

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programmed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

Some memory systems 110 may detect an error associated a stuck condition in which the memory system may be unable to transmit commands, receive command, or perform operations. In response to detecting the error associated with the stuck condition, the memory system 110 may store error information indicating the type of detected error in a non-volatile memory device 130 and perform a reset operation to exit the stuck condition. Here, the memory system 110 (or a user of the memory system 110) may access the stored error information in the non-volatile memory device 130 after resetting the memory system 110 in order to perform one or more debugging operations after resetting the memory system 110 to exit the stuck condition. In some cases, the error information may indicate a source of the reset or a component associated with initiating the reset operation. For example, the error information may indicate that the reset operation was initiated by a power management unit of the memory system, a direct memory execution of the memory system, an HS of the memory system, or a watchdog timer of the memory system. Additionally, the error information may include one or more of a first value corresponding to a real time counter of the memory system, a second value stored by a hardware register of the memory system, and firmware data associated with the memory system. In some other cases, the error information may additionally include a program counter register value, task information associated with the memory system, bank information associated with the memory system, exception event information associated with the error, or a combination thereof.

In some cases, the memory system 110 may detect an error associated with a stuck condition and be unable to store the error information in the non-volatile memory device 130 prior to performing the reset operation. For example, the memory system 110 may detect the error during a boot-up operation of the memory system 110. Here, the memory system 110 may not have executed firmware associated with the non-volatile memory device 130 prior to detecting the error and may thus, be unable to access the non-volatile memory device 130. In cases where the memory system 110 does not store the error information in the non-volatile memory device 130 prior to performing the reset operation, the memory system 110 (or the user of the memory system 110) may be unable to perform a debugging operation after resetting the memory system 110.

In the example of the system 100, the memory system 110 may store error information associated with stuck conditions even in cases that the memory system 110 is unable to store the error information in the non-volatile memory device 130. For example, in response to detecting an error associated with a stuck condition, the memory system 110 may store error information associated with the detected error in a persistent register 140 (e.g., a sticky register) at the memory system 110. Here, the memory system 110 may access the error information stored in the persistent register 140 even after resetting the memory system 110. Additionally, the memory system 110 may store the error information associated with the detected error in a cache 125 at the memory system 110 that maintains stored information during reset operations. In both cases, after resetting, the memory system 110 may transfer the error information (e.g., from the persistent register 140, from the cache 125, from both the cache 125 and the persistent register 140) to the non-volatile memory device 130 after resetting the memory system 110. Then, the memory system 110 (or the user of the memory system 110) may optionally perform a debugging operation using the error information stored in the persistent register 140 and, in some cases additionally stored in the cache 125, during the reset operation.

The system 100 may include any quantity of non-transitory computer readable media that support error information storage for boot-up procedures. For example, the host system 105, the memory system controller 115, or a memory device 130 (e.g., a local controller 135) may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

Figure 2:
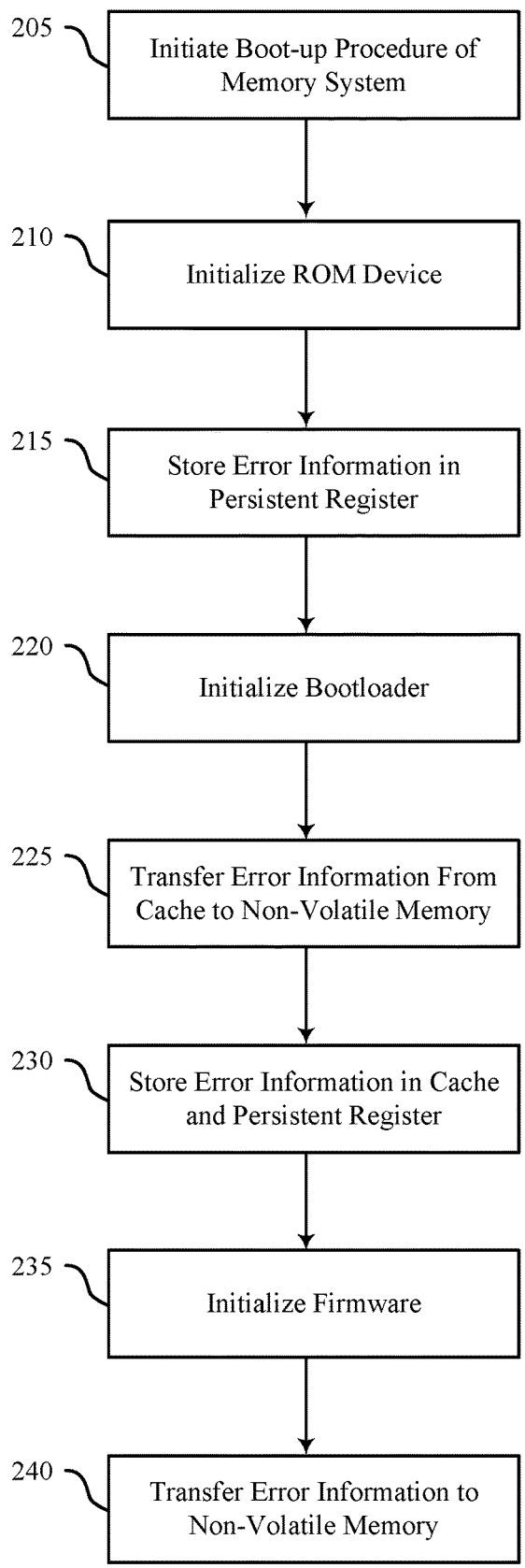
FIGS. 2 and 3 illustrates an example of a system that supports error information storage for boot-up procedures in accordance with examples as disclosed herein.

FIG. 2 illustrates an example of a process flow 200 that supports error information storage for boot-up procedures in accordance with examples as disclosed herein. In some cases, the process flow 200 may implement aspects of the system as described with reference to FIG. 1. For example, the memory system 110 as described with reference to FIG. 1 may implement the process flow 200 (e.g., in response to performing a boot-up procedure of the memory system). In some cases, a memory system implementing the process flow 200 may store error information associated with stuck conditions in a persistent register, a cache, or both during reset operations of the memory system. Aspects of the process flow 200 may be implemented by a controller, among other components. Additionally, or alternatively, aspects of the process flow 200 may be implemented as instructions stored in memory (e.g., firmware stored in a memory coupled with the memory system 110, the memory devices 130). For example, the instructions, when executed by a controller (e.g., the memory system controller 115, a local controller 135), may cause the controller to perform the operations of the process flow 200.

At 205, a boot-up procedure of a memory system may be initiated. For example, the memory system may initiate the boot-up procedure based on receiving a command from a host system. Additionally or alternatively, the memory system may initiate the boot-up procedure in response to receiving power (e.g., based on the host system performing a boot-up procedure of a system including the host system and the memory system). In some other cases, the memory system may initiate the boot-up procedure based on performing a reset operation of the memory system. For example, the memory system resetting may include the memory system performing the boot-up procedure of the memory system.

At 210, a ROM device at the memory system may be initialized. For example, the memory system may initialize the ROM device (e.g., may initiate a boot-up procedure of the ROM device) as part of the boot-up procedure of the memory system. In some cases, initializing the ROM device may correspond to performing a ROM entry at the memory system.

At 215, error information may be stored in a persistent register at the memory system. For example, the memory system may store information corresponding to a running status of the memory system in response to initializing the ROM device. In cases that the memory system detects an error associated with initializing the ROM device, the memory system may store error information (e.g., indicating a type of error detected) in the persistent register. In some cases, the error information may additionally include an indication of a source of the reset operation or an indication of a component of the memory system initiating the reset operation. For example, the error information may indicate that the reset operation was initiated by a power management unit of the memory system, a direct memory execution of the memory system, an HS of the memory system, or a watchdog timer of the memory system. Additionally, the error information may include one or more of a first value corresponding to a real time counter of the memory system, a second value stored by a hardware register of the memory system, and firmware data associated with the memory system.

In cases that the memory system detects an error associated with a stuck condition in response to initializing the ROM device, the memory system may perform a reset operation (e.g., instead of proceeding to 220). In this case, the memory system may rely on the error information stored in the persistent register to perform one or more debugging operations after performing the reset operation.

At 220, a bootloader of the memory system may be initialized. For example, the memory system may initialize the bootloader (e.g., may initiate a boot-up procedure of the bootloader) as part of the boot-up procedure of the memory system. In some cases, initializing the bootloader may correspond to performing a bootloader entry at the memory system.

At 225, error information stored in a cache at the memory system may be transferred to a non-volatile memory device at the memory system. For example, the cache may store error information associated with one or more previously-detected errors. At 225, the memory system may transfer the error information associated with one or more previously-detected errors to the non-volatile memory device. In cases that the cache stores error information associated with two or more detected errors, the memory system may transfer a subset of the error information stored at the cache. For example, the memory system may transfer error information associated with an error detected prior to other errors corresponding to error information stored in the cache. That is, the memory system may transfer error information associated with one detected error (e.g., an error detected prior to other errors associated with error information stored in the cache) and may not transfer error information associated with one or more other detected errors.

At 230, error information may be stored in the cache. For example, the memory system may store information corresponding to a running status of the memory system in response to initializing the bootloader. In cases that the memory system detects an error associated with initializing the bootloader, the memory system may store error information (e.g., indicating a type of error detected) in the cache. For example, the memory system may overwrite the error information transferred to the non-volatile memory device at 225 with error information associated with initializing the bootloader (e.g., as described at 220). Additionally, the memory system may store the error information (e.g., indicating a type of error detected in response to initializing the bootloader of the memory system) in the persistent register at the memory system.

In cases that the memory system detects an error associated with a stuck condition in response to initializing the bootloader, the memory system may perform a reset operation (e.g., instead of proceeding to 230). In this case, the memory system may rely on the error information stored in the persistent register and the cache to perform one or more debugging operations after performing the reset operation.

At 235, firmware of the memory system may be initialized. For example, the memory system may initialize the firmware (e.g., may initiate an execution of the firmware) as part of the boot-up procedure of the memory system. In some cases, initializing the firmware may correspond to performing firmware entry at the memory system.

In cases that the memory system detects an error associated with a stuck condition in response to initializing the firmware, the memory system may store error information in the persistent register and the cache prior to performing a reset operation. In some examples, the error information may include a value stored by a program counter register of a controller of the memory system (e.g., when the error is detected). Additionally, the error information may include task and bank information at a time when the error is detected and an indication of a type of the error detected (e.g., an indication of an exception event such as detected voltage drops, an assert exception event, a central processing unit exception event, a soft error rate exception event). After storing the error information in the persistent register and the cache, the memory system may perform a reset operation (e.g., instead of proceeding to 240). In this case, the memory system may rely on the error information stored in the persistent register and the cache to perform one or more debugging operations after performing the reset operation.

At 240, error information may be transferred to the non-volatile memory device at the memory system. For example, the memory system may access the non-volatile memory device based on initializing the firmware at 235. At 240, the memory system may transfer the error information stored in the persistent register and the cache to the non-volatile memory device. For example, the memory system may transfer the error information to an error log stored in the non-volatile memory device. In some cases, the memory system may transfer the error information to the non-volatile memory device in response to completing a boot-up procedure of the memory system.

While the process flow 200 is descried with reference to a memory system performing a boot-up procedure of the memory system, a memory system may implement portions of the process flow based on other procedures as well. For example, in cases that a memory system detects an error associated with a stuck condition in response to entering or exiting a lower power mode, the memory system may store error information in the persistent register and the cache (e.g., as descried at 230). That is, the memory system may not supply power to one or more memory devices (e.g., some hardware modules may not be powered or may not be resumed) when operating according to a lower power mode. Additionally, the memory system may not resume firmware when operating according to the lower power mode. In some cases, the memory system may be unable to store the error information in the non-volatile memory device prior to resetting to exit the stuck condition, so the memory system may instead store the error information in the persistent register and the cache.

Figure 3:
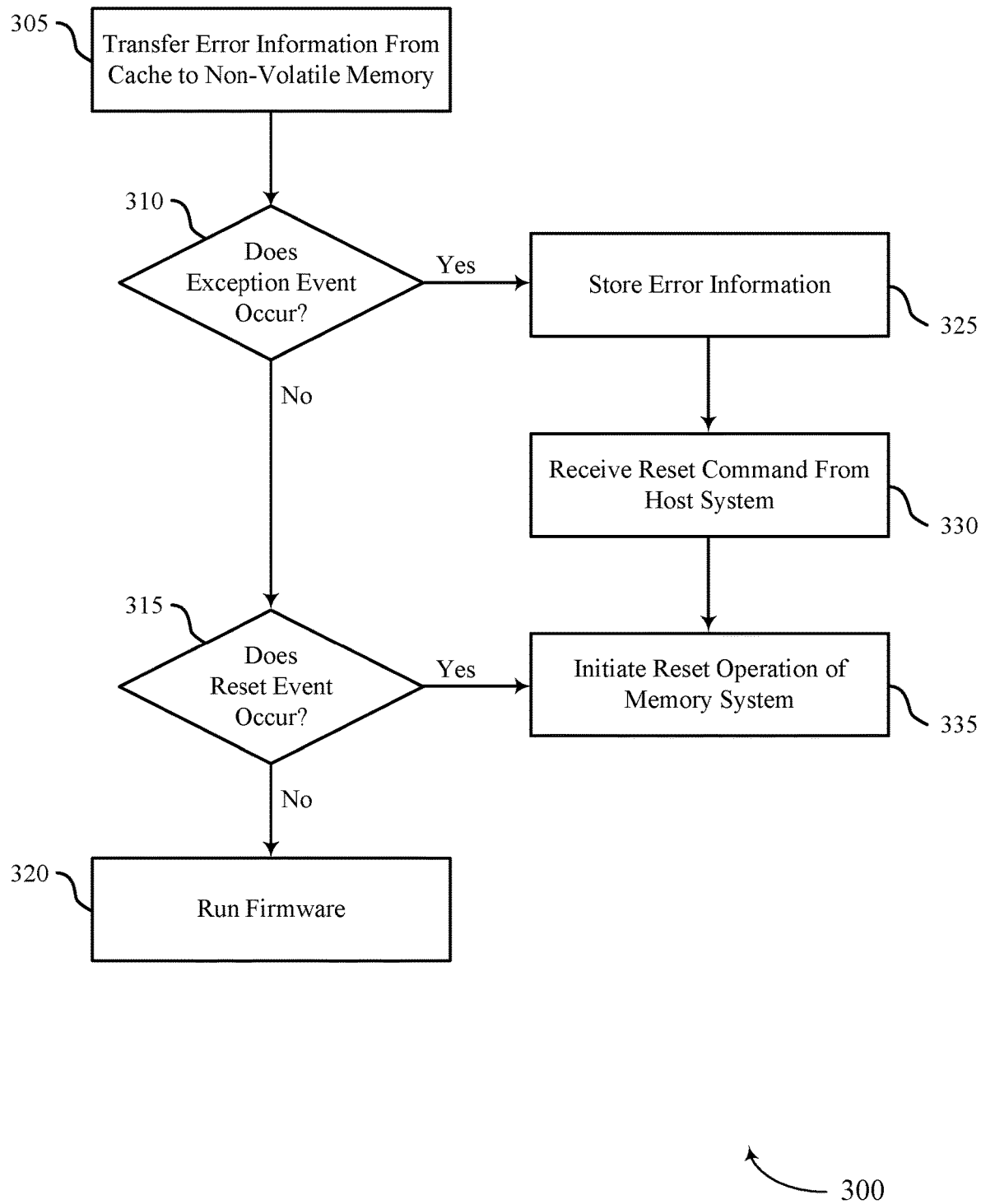

FIG. 3 illustrates an example of a process flow 300 that supports error information storage for boot-up procedures in accordance with examples as disclosed herein. In some cases, the process flow 300 may include aspects of the system and the process flow as described with reference to FIGS. 1 and 2. For example, the memory system 110 as described with reference to FIG. 1 may implement the process flow 300. Additionally, memory systems that implement process flow 200 may additionally implement the process flow 300. For example, a memory system that has initialized a bootloader of the memory system (e.g., as described at 220) may implement the process flow 300.

Aspects of the process flow 300 may be implemented by a controller, among other components. Additionally, or alternatively, aspects of the process flow 300 may be implemented as instructions stored in memory (e.g., firmware stored in a memory coupled with the memory system 110, the memory devices 130). For example, the instructions, when executed by a controller (e.g., the memory system controller 115, a local controller 135), may cause the controller to perform the operations of the process flow 300.

At 305, error information stored in a cache at the memory system may be transferred to a non-volatile memory device at the memory system. For example, the cache may store error information associated with one or more previously-detected errors. At 305, the memory system may transfer the error information associated with one or more previously-detected errors to the non-volatile memory device. In cases that the cache stores error information associated with two or more detected errors, the memory system may transfer a subset of the error information stored at the cache. For example, the memory system may transfer error information associated with an error detected prior to other errors corresponding to error information stored in the cache. That is, the memory system may transfer error information associated with one detected error (e.g., an error detected prior to other errors associated with error information stored in the cache) and may not transfer error information associated with one or more other detected errors.

At 310, whether an exception event occurs may be determined. For example, the memory system may determine whether an error is detected (e.g., an error corresponding to an exception event). For example, the memory system may determine whether a detected voltage drops, an assert exception event occurs, a central processing unit exception event occurs, or a soft error rate exception event occurs. In cases that the memory system determines that an exception event occurs, the memory system may proceed to 325. Additionally, in cases that the memory system determines that an exception event does not occur (e.g., in cases that the memory system fails to detect an error), the memory system may proceed to 315.

At 315, whether a reset event occurs may be determined. For example, the memory system may determine whether a reset event has occurred. In cases that the memory system determines that a reset event occurs, the memory system may proceed to 335. Additionally, in cases that the memory system fails to detect a reset event, the memory system may proceed to 320.

At 320, firmware of the memory system may be run. For example, a memory system may execute firmware.

At 325, error information may be stored at the memory system. That is, in response to detecting the exception event at 310, the memory system may store error information. In some cases, the memory system may store the error information in a persistent register at the memory system. Additionally, the memory system may store the error information in a cache at the memory system. Further, in cases that the memory system has access to a non-volatile memory device of the memory system, the memory system may store the error information in the non-volatile memory device of the memory system.

At 330, a reset command may be received from a host system. That is, the memory system may receive a reset command from the host system. Additionally or alternatively, the memory system may generate an internal command to perform the reset operation.

At 335, a reset operation of the memory system may be initiated (e.g., in response to receiving the reset command, in response to an internally-generated command). In some cases, the memory system may proceed to implement the process flow 200 based on initiating the reset operation at 335.

Figure 4:
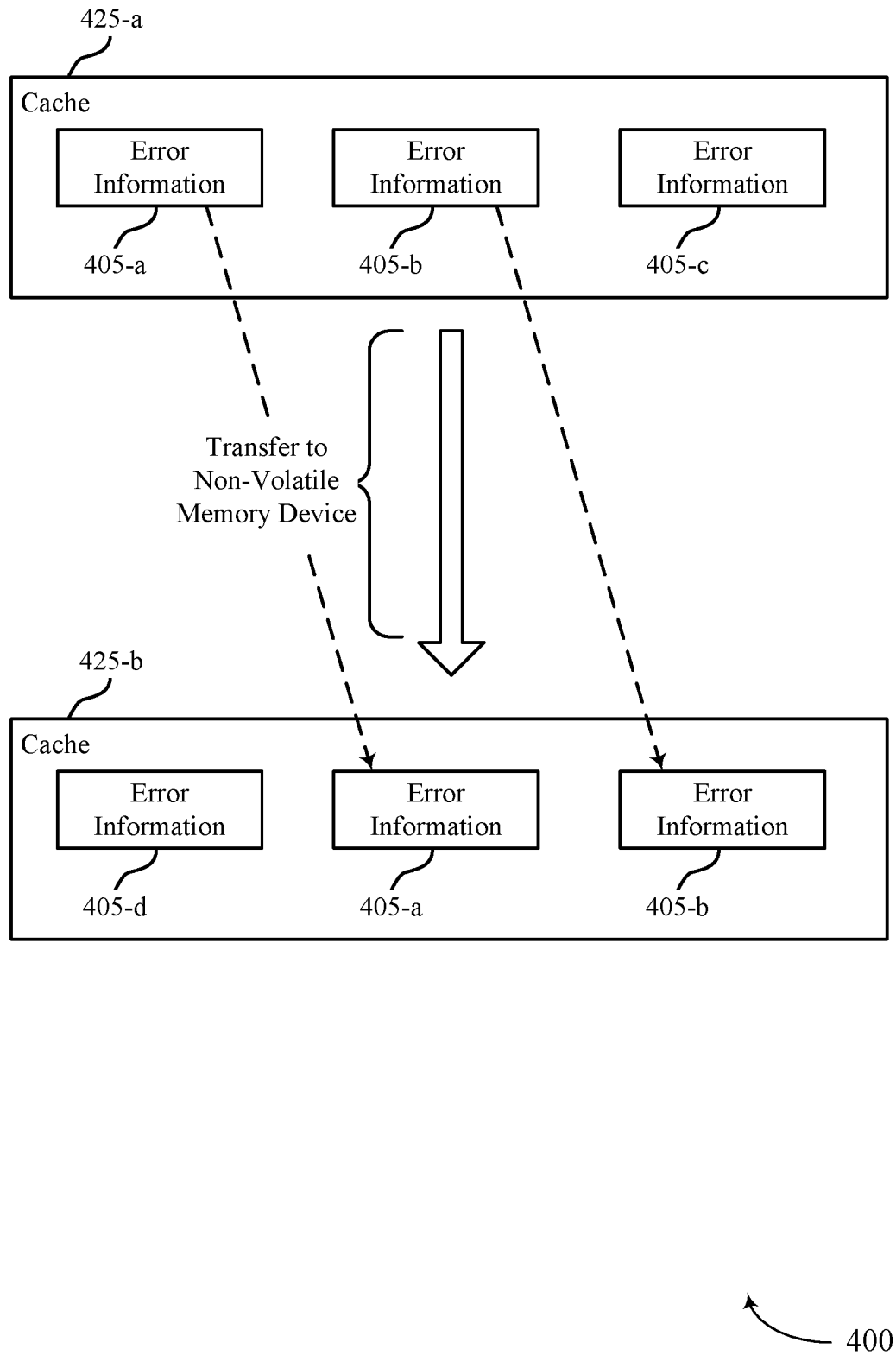
FIG. 4 illustrates an example of a transferring procedure that supports error information storage for boot-up procedures in accordance with examples as disclosed herein.

FIG. 4 illustrates an example of a transfer procedure 400 that supports error information storage for boot-up procedures in accordance with examples as disclosed herein. In some cases, the transfer procedure 400 may include aspects of the system and process flows as described with reference to FIGS. 1 through 3. For example, the cache 425 and the error information 405 may be examples of the cache and error information as described with reference to FIGS. 1 through 3.

In some cases, a memory system may implement the transfer procedure 400 in response to implementing the process flows as described with reference to FIGS. 1 and 2. That is, a memory system may perform the transfer procedure 400 to transfer error information 405 from the cache 425 to a non-volatile memory device at the memory system. The cache 425-*a* may illustrate the error information 405 stored in the cache prior to transferring the error information 405 stored in the cache 425-*a* to the non-volatile memory device. Additionally, the cache 425-*b* may illustrate the error information 405 stored in the cache after transferring the error information 405 in the cache 425-*a* to the non-volatile memory device.

The cache 425-*a* may store error information 405 associated with multiple previously-detected errors at the memory system. For example, the error information 405-*a* may be associated with a first error detected after a second error corresponding to the error information 405-*b*. Additionally, the error information 405-*b* may be associated with a second error detected after a third error corresponding to the error information 405-*c*.

A memory system may transfer the error information 405-*a*, 405-*b*, and 405-*c* to a non-volatile memory device (e.g., based on initializing a bootloader of the memory system, based on executing firmware at the system). In some cases, in response to transferring the error information 405-*a*, 405-*b*, and 405-*c* to the non-volatile memory device, the memory system may store current error information 405-*d* in the cache 425-*b*. For example, the memory system may detect an error after transferring the error information 405-*a*, 405-*b*, and 405-*c* to the none-volatile memory device and may store error information 405-*d* associated with the detected error in the cache 425-*d*. Additionally, the memory system may transfer the error information 405-*d* from a persistent register at the memory system to the cache 425-*b*. In either case, after transferring the error information 405-*a*, 405-*b*, and 405-*c* to the non-volatile memory device, the memory system may store the error information 405-*d* in the cache 425-*b*.

The memory system may store the error information 405-*d* in place of the error information 405-*c* associated with an error detected before errors corresponding to the error information 405-*a* and 405-*b*. For example, the memory system may overwrite the error information 405-*c* with the error information 405-*d*. In the example of the transfer procedure 400, after transferring the error information 405 to the non-volatile memory device, the cache 425-*b* may store the error information 405-*d* (e.g., associated with an error detected more recently than errors associated with the error information 405-*a* and 405-*b*) and the error information 405-*a* and 405-*b* (e.g., stored in the cache 425-*a* prior to transferring the error information 405 to the non-volatile memory device).

Figure 5:
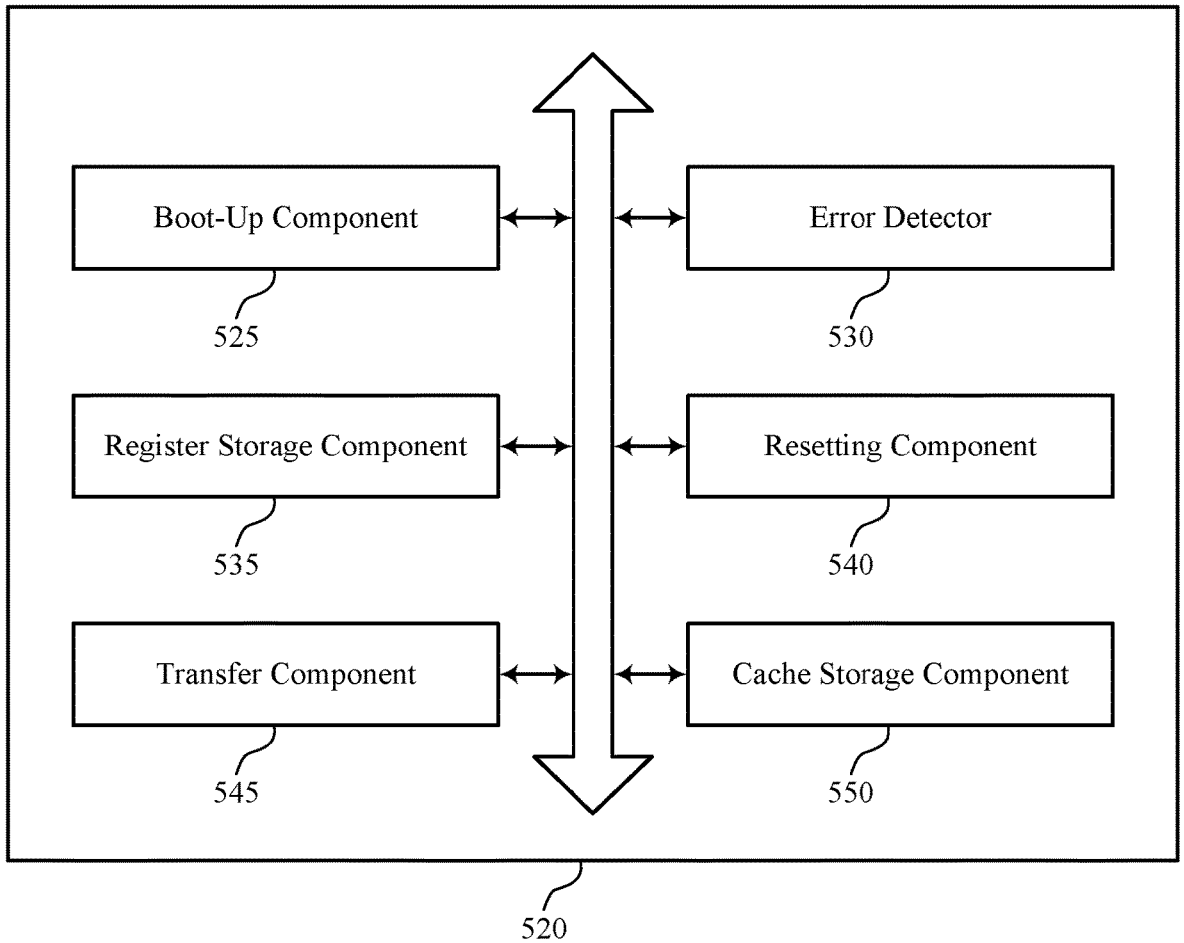
FIG. 5 shows a block diagram of a memory system that supports error information storage for boot-up procedures in accordance with examples as disclosed herein.

FIG. 5 shows a block diagram 500 of a memory system 520 that supports error information storage for boot-up procedures in accordance with examples as disclosed herein. The memory system 520 may be an example of aspects of a memory system as described with reference to FIGS. 1 through 4. The memory system 520, or various components thereof, may be an example of means for performing various aspects of error information storage for boot-up procedures as described herein. For example, the memory system 520 may include a boot-up component 525, an error detector 530, a register storage component 535, a resetting component 540, a transfer component 545, a cache storage component 550, or any combination thereof. Each of these components may communicate, directly or indirectly, with one another (e.g., via one or more buses).

The boot-up component 525 may be configured as or otherwise support a means for initializing a ROM device at a memory system based at least in part on performing a boot-up procedure of the memory system. The error detector 530 may be configured as or otherwise support a means for detecting, based at least in part on initializing the ROM device, an error associated with performing the boot-up procedure of the memory system. The register storage component 535 may be configured as or otherwise support a means for storing, in a persistent register at the memory system, error information associated with performing the boot-up procedure of the memory system based at least in part on detecting the error. The resetting component 540 may be configured as or otherwise support a means for resetting the memory system based at least in part on storing the error information and detecting the error. The transfer component 545 may be configured as or otherwise support a means for transferring the error information from the persistent register to a non-volatile memory device at the memory system based at least in part on resetting the memory system.

In some examples, the boot-up component 525 may be configured as or otherwise support a means for executing a second boot-up procedure of a bootloader of the memory system based at least in part on resetting the memory system. In some examples, the transfer component 545 may be configured as or otherwise support a means for transferring, from the persistent register of the memory system to a cache and based at least in part on executing the second boot-up procedure of the bootloader, the error information associated, where transferring the error information to the non-volatile memory device is based at least in part on transferring the error information to the cache.

In some examples, the boot-up component 525 may be configured as or otherwise support a means for executing a second boot-up procedure of the memory system based at least in part on resetting the memory system, where transferring the error information to the non-volatile memory device is based at least in part on executing the second boot-up procedure.

In some examples, the transfer component 545 may be configured as or otherwise support a means for transferring, based at least in part on completing the second boot-up procedure, the error information from a cache of the memory system to the non-volatile memory device.

In some examples, detecting the error includes detecting the error associated with initializing the ROM device. In some examples, the error information is associated with initializing the ROM device.

In some examples, the boot-up component 525 may be configured as or otherwise support a means for initializing a bootloader of the memory system based at least in part on initializing the ROM device and performing the boot-up procedure of the memory system, where detecting the error is based at least in part on initializing the bootloader. In some examples, the cache storage component 550 may be configured as or otherwise support a means for storing the error information in a cache at the memory system, where resetting the memory system is based at least in part on storing the error information in the cache.

In some examples, detecting the error includes detecting the error associated with initializing the bootloader of the memory system. In some examples, the error information is associated with initializing the bootloader of the memory system.

In some examples, the boot-up component 525 may be configured as or otherwise support a means for switching, based at least in part on initializing the bootloader of the memory system, from a first power mode associated with a first power consumption to a second power mode associated with a second power consumption, where detecting the error is based at least in part on the switching.

In some examples, detecting the error includes detecting the error associated with switching from the first power mode to the second power mode. In some examples, the error information is associated with switching from the first power mode to the second power mode.

In some examples, the transfer component 545 may be configured as or otherwise support a means for transferring the error information from the cache to the non-volatile memory device at the memory system based at least in part on resetting the memory system.

In some examples, the error information includes an indication of a component of the memory system that initiates the resetting the memory system. In some examples, the cache includes static random access memory.

In some examples, the boot-up component 525 may be configured as or otherwise support a means for initializing firmware at the memory system based at least in part on initializing the ROM device, where detecting the error is based at least in part on initializing the firmware at the memory system. In some examples, the cache storage component 550 may be configured as or otherwise support a means for storing the error information in a cache at the memory system, where resetting the memory system is based at least in part on storing the error information in the cache.

In some examples, the error information includes a program counter register value, task information associated with the memory system, bank information associated with the bank information, exception event information associated with the error, or a combination thereof.

In some examples, the error information includes a first value corresponding to a real time counter of the memory system, a second value stored by a hardware register of the memory system, firmware data associated with the memory system, or a combination thereof.

In some examples, the persistent register maintains a value stored in the persistent register throughout a resetting of the memory system. In some examples, transferring the error information from the persistent register to the non-volatile memory device is based at least in part on the persistent register maintaining the value stored in the persistent register throughout resetting the memory system.

Figure 6:
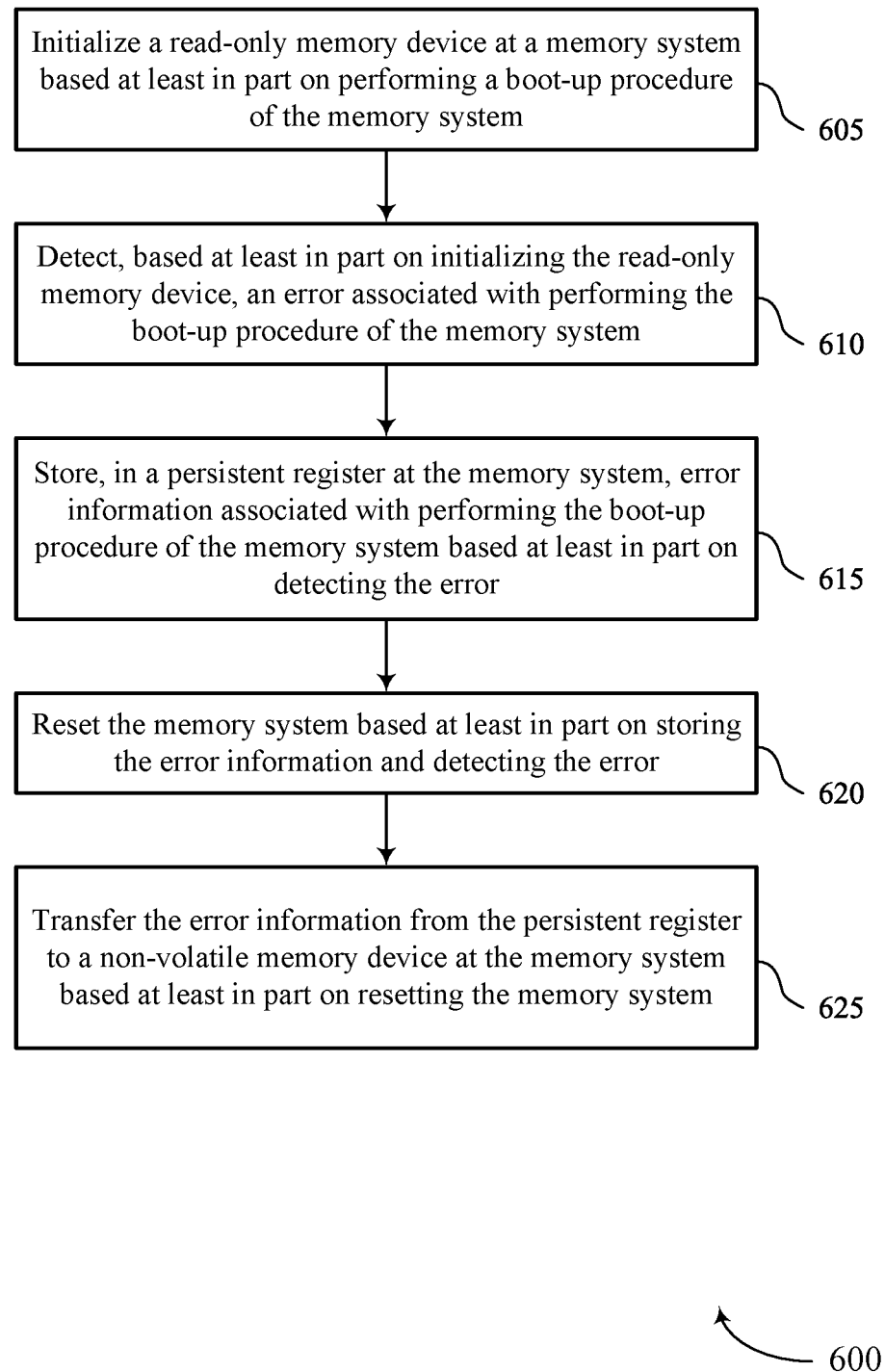
FIG. 6 shows a flowchart illustrating a method or methods that support error information storage for boot-up procedures in accordance with examples as disclosed herein.

FIG. 6 shows a flowchart illustrating a method 600 that supports error information storage for boot-up procedures in accordance with examples as disclosed herein. The operations of method 600 may be implemented by a memory system or its components as described herein. For example, the operations of method 600 may be performed by a memory system as described with reference to FIGS. 1 through 5. In some examples, a memory system may execute a set of instructions to control the functional elements of the device to perform the described functions. Additionally, or alternatively, the memory system may perform aspects of the described functions using special-purpose hardware.

At 605, the method may include initializing a ROM device at a memory system based at least in part on performing a boot-up procedure of the memory system. The operations of 605 may be performed in accordance with examples as disclosed herein. In some examples, aspects of the operations of 605 may be performed by a boot-up component 525 as described with reference to FIG. 5.

At 610, the method may include detecting, based at least in part on initializing the ROM device, an error associated with performing the boot-up procedure of the memory system. The operations of 610 may be performed in accordance with examples as disclosed herein. In some examples, aspects of the operations of 610 may be performed by an error detector 530 as described with reference to FIG. 5.

At 615, the method may include storing, in a persistent register at the memory system, error information associated with performing the boot-up procedure of the memory system based at least in part on detecting the error. The operations of 615 may be performed in accordance with examples as disclosed herein. In some examples, aspects of the operations of 615 may be performed by a register storage component 535 as described with reference to FIG. 5.

At 620, the method may include resetting the memory system based at least in part on storing the error information and detecting the error. The operations of 620 may be performed in accordance with examples as disclosed herein. In some examples, aspects of the operations of 620 may be performed by a resetting component 540 as described with reference to FIG. 5.

At 625, the method may include transferring the error information from the persistent register to a non-volatile memory device at the memory system based at least in part on resetting the memory system. The operations of 625 may be performed in accordance with examples as disclosed herein. In some examples, aspects of the operations of 625 may be performed by a transfer component 545 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for initializing a ROM device at a memory system based at least in part on performing a boot-up procedure of the memory system; detecting, based at least in part on initializing the ROM device, an error associated with performing the boot-up procedure of the memory system; storing, in a persistent register at the memory system, error information associated with performing the boot-up procedure of the memory system based at least in part on detecting the error; resetting the memory system based at least in part on storing the error information and detecting the error; and transferring the error information from the persistent register to a non-volatile memory device at the memory system based at least in part on resetting the memory system.

Aspect 2: The method, apparatus, or non-transitory computer-readable medium of aspect 1, further including operations, features, circuitry, logic, means, or instructions, or any combination thereof for executing a second boot-up procedure of a bootloader of the memory system based at least in part on resetting the memory system and transferring, from the persistent register of the memory system to a cache and based at least in part on executing the second boot-up procedure of the bootloader, the error information associated, where transferring the error information to the non-volatile memory device is based at least in part on transferring the error information to the cache.

Aspect 3: The method, apparatus, or non-transitory computer-readable medium of any of aspects 1 through 2, further including operations, features, circuitry, logic, means, or instructions, or any combination thereof for executing a second boot-up procedure of the memory system based at least in part on resetting the memory system, where transferring the error information to the non-volatile memory device is based at least in part on executing the second boot-up procedure.

Aspect 4: The method, apparatus, or non-transitory computer-readable medium of aspect 3, further including operations, features, circuitry, logic, means, or instructions, or any combination thereof for transferring, based at least in part on completing the second boot-up procedure, the error information from a cache of the memory system to the non-volatile memory device.

Aspect 5: The method, apparatus, or non-transitory computer-readable medium of any of aspects 1 through 4 where detecting the error includes detecting the error associated with initializing the ROM device and the error information is associated with initializing the ROM device.

Aspect 6: The method, apparatus, or non-transitory computer-readable medium of any of aspects 1 through 5, further including operations, features, circuitry, logic, means, or instructions, or any combination thereof for initializing a bootloader of the memory system based at least in part on initializing the ROM device and performing the boot-up procedure of the memory system, where detecting the error is based at least in part on initializing the bootloader and storing the error information in a cache at the memory system, where resetting the memory system is based at least in part on storing the error information in the cache.

Aspect 7: The method, apparatus, or non-transitory computer-readable medium of aspect 6 where detecting the error includes detecting the error associated with initializing the bootloader of the memory system and the error information is associated with initializing the bootloader of the memory system.

Aspect 8: The method, apparatus, or non-transitory computer-readable medium of any of aspects 6 through 7, further including operations, features, circuitry, logic, means, or instructions, or any combination thereof for switching, based at least in part on initializing the bootloader of the memory system, from a first power mode associated with a first power consumption to a second power mode associated with a second power consumption, where detecting the error is based at least in part on the switching.

Aspect 9: The method, apparatus, or non-transitory computer-readable medium of aspect 8 where detecting the error includes detecting the error associated with switching from the first power mode to the second power mode and the error information is associated with switching from the first power mode to the second power mode.

Aspect 10: The method, apparatus, or non-transitory computer-readable medium of any of aspects 6 through 9, further including operations, features, circuitry, logic, means, or instructions, or any combination thereof for transferring the error information from the cache to the non-volatile memory device at the memory system based at least in part on resetting the memory system.

Aspect 11: The method, apparatus, or non-transitory computer-readable medium of any of aspects 6 through 10 where the error information includes an indication of a component of the memory system that initiates the resetting the memory system.

Aspect 12: The method, apparatus, or non-transitory computer-readable medium of any of aspects 6 through 11 where the cache includes static random access memory.

Aspect 13: The method, apparatus, or non-transitory computer-readable medium of any of aspects 1 through 12, further including operations, features, circuitry, logic, means, or instructions, or any combination thereof for initializing firmware at the memory system based at least in part on initializing the ROM device, where detecting the error is based at least in part on initializing the firmware at the memory system and storing the error information in a cache at the memory system, where resetting the memory system is based at least in part on storing the error information in the cache.

Aspect 14: The method, apparatus, or non-transitory computer-readable medium of aspect 13 where the error information includes a program counter register value, task information associated with the memory system, bank information associated with the bank information, exception event information associated with the error, or a combination thereof.

Aspect 15: The method, apparatus, or non-transitory computer-readable medium of any of aspects 1 through 14 where the error information includes a first value corresponding to a real time counter of the memory system, a second value stored by a hardware register of the memory system, firmware data associated with the memory system, or a combination thereof.

Aspect 16: The method, apparatus, or non-transitory computer-readable medium of any of aspects 1 through 15 where the persistent register maintains a value stored in the persistent register throughout a resetting of the memory system and transferring the error information from the persistent register to the non-volatile memory device is based at least in part on the persistent register maintaining the value stored in the persistent register throughout resetting the memory system.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action.

In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a read-only memory device;
   a non-volatile memory device;
   a persistent register; and
   a controller coupled with the read-only memory device, the non-volatile memory device, and the persistent register, wherein the controller is configured to cause the apparatus to:
      initialize the read-only memory device based at least in part on performing a boot-up procedure of the apparatus;
      detect, based at least in part on initializing the read-only memory device, an error associated with performing the boot-up procedure of the apparatus:
      store, in the persistent register, error information associated with performing the boot-up procedure of the apparatus based at least in part on detecting the error;
      reset the apparatus based at least in part on storing the error information and detecting the error; and
      transfer the error information from the persistent register to the non-volatile memory device based at least in part on resetting the apparatus.

2. The apparatus of claim 1, wherein the controller is further configured to cause the apparatus to:
   execute a second boot-up procedure of a bootloader of the apparatus based at least in part on resetting the apparatus; and
   transfer, from the persistent register to a cache and based at least in part on executing the second boot-up procedure of the bootloader, the error information associated, wherein transferring the error information to the non-volatile memory device is based at least in part on transferring the error information to the cache.

3. The apparatus of claim 1, wherein the controller is further configured to cause the apparatus to:
   execute a second boot-up procedure of the apparatus based at least in part on resetting the apparatus, wherein transferring the error information to the non-volatile memory device is based at least in part on executing the second boot-up procedure.

4. The apparatus of claim 1, wherein:
   detecting the error comprises detecting the error associated with initializing the read-only memory device; and
   the error information is associated with initializing the read-only memory device.

5. The apparatus of claim 1, wherein the controller is further configured to cause the apparatus to:
   initialize a bootloader of the apparatus based at least in part on initializing the read-only memory device and performing the boot-up procedure of the apparatus, wherein detecting the error is based at least in part on initializing the bootloader; and
   store the error information in a cache at the apparatus, wherein resetting the apparatus is based at least in part on storing the error information in the cache.

6. The apparatus of claim 1, wherein the controller is further configured to cause the apparatus to:
   initialize firmware at the apparatus based at least in part on initializing the read-only memory device, wherein detecting the error is based at least in part on initializing the firmware at the apparatus; and
   store the error information in a cache at the apparatus, wherein resetting the apparatus is based at least in part on storing the error information in the cache.

7. The apparatus of claim 1, wherein the error information comprises a first value corresponding to a real time counter of the apparatus, a second value stored by a hardware register of the apparatus, firmware data associated with the apparatus, or a combination thereof.

8. The apparatus of claim 1, wherein:
   the persistent register maintains a value stored in the persistent register throughout a resetting of the apparatus; and
   transferring the error information from the persistent register to the non-volatile memory device is based at least in part on the persistent register maintaining the value stored in the persistent register throughout resetting the apparatus.

9. The apparatus of claim 3, wherein the controller is further configured to cause the apparatus to:
   transfer, based at least in part on completing the second boot-up procedure, the error information from a cache of the apparatus to the non-volatile memory device.

10. The apparatus of claim 5, wherein:
    detecting the error comprises detecting the error associated with initializing the bootloader of the apparatus; and
    the error information is associated with initializing the bootloader of the apparatus.

11. The apparatus of claim 5, wherein the controller is further configured to cause the apparatus to:
    switch, base at least in part on initializing the bootloader of the apparatus, from a first power mode associated with a first power consumption to a second power mode associated with a second power consumption, wherein detecting the error is based at least in part on the switching.

12. The apparatus of claim 5, wherein the controller is further configured to cause the apparatus to:
    transfer the error information from the cache to the non-volatile memory device based at least in part on resetting the apparatus.

13. The apparatus of claim 5, wherein the error information comprises an indication of a component of the apparatus that initiates the resetting the apparatus.

14. The apparatus of claim 5, wherein:
    the cache comprises static random access memory.

15. The apparatus of claim 6, wherein the error information comprises a program counter register value, task information associated with the apparatus, bank information associated with the bank information, exception event information associated with the error, or a combination thereof.

16. The apparatus of claim 11, wherein:
   detecting the error comprises detecting the error associated with switching from the first power mode to the second power mode; and
   the error information is associated with switching from the first power mode to the second power mode.

17. A non-transitory computer-readable medium storing code comprising instructions which, when executed by a processor of an electronic device, cause the electronic device to:
   initialize a read-only memory device at the electronic device based at least in part on performing a boot-up procedure of the electronic device;
   detect, based at least in part on initializing the read-only memory device, an error associated with performing the boot-up procedure of the electronic device;
   store, in a persistent register at the electronic device, error information associated with performing the boot-up procedure of the electronic device based at least in part on detecting the error;
   reset the electronic device based at least in part on storing the error information and detecting the error; and
   transfer the error information from the persistent register to a non-volatile memory device at the electronic device based at least in part on resetting the electronic device.

18. The non-transitory computer-readable medium of claim 17, wherein the instructions, when executed by the processor of the electronic device, further cause the electronic device to:
   execute a second boot-up procedure of a bootloader of the electronic device based at least in part on resetting the electronic device; and
   transfer, from the persistent register of the electronic device to a cache and based at least in part on executing the second boot-up procedure of the bootloader, the error information associated, wherein transferring the error information to the non-volatile memory device is based at least in part on transferring the error information to the cache.

19. The non-transitory computer-readable medium of claim 17, wherein the instructions, when executed by the processor of the electronic device, further cause the electronic device to execute a second boot-up procedure of the electronic device based at least in part on resetting the electronic device, wherein transferring the error information to the non-volatile memory device is based at least in part on executing the second boot-up procedure.

20. The non-transitory computer-readable medium of claim 17, wherein:
   the instructions to detect the error, when executed by the processor of the electronic device, further cause the electronic device to detect the error comprises detecting the error associated with initializing the read-only memory device; and
   the error information is associated with initializing the read-only memory device.

21. The non-transitory computer-readable medium of claim 17, wherein the instructions, when executed by the processor of the electronic device, further cause the electronic device to:
   initialize a bootloader of the electronic device based at least in part on initializing the read-only memory device and performing the boot-up procedure of the electronic device, wherein detecting the error is based at least in part on initializing the bootloader; and
   store the error information in a cache at the electronic device, wherein resetting the electronic device is based at least in part on storing the error information in the cache.

22. The non-transitory computer-readable medium of claim 19, wherein the instructions, when executed by the processor of the electronic device, further cause the electronic device to transfer, based at least in part on completing the second boot-up procedure, the error information from a cache of the electronic device to the non-volatile memory device.

23. A method, comprising:
   initializing a read-only memory device at a memory system based at least in part on performing a boot-up procedure of the memory system;
   detecting, based at least in part on initializing the read-only memory device, an error associated with performing the boot-up procedure of the memory system;
   storing, in a persistent register at the memory system, error information associated with performing the boot-up procedure of the memory system based at least in part on detecting the error;
   resetting the memory system based at least in part on storing the error information and detecting the error; and
   transferring the error information from the persistent register to a non-volatile memory device at the memory system based at least in part on resetting the memory system.

24. The method of claim 23, further comprising:
   executing a second boot-up procedure of a bootloader of the memory system based at least in part on resetting the memory system; and
   transferring, from the persistent register of the memory system to a cache and based at least in part on executing the second boot-up procedure of the bootloader, the error information associated, wherein transferring the error information to the non-volatile memory device is based at least in part on transferring the error information to the cache.

25. The method of claim 23, further comprising:
   executing a second boot-up procedure of the memory system based at least in part on resetting the memory system, wherein transferring the error information to the non-volatile memory device is based at least in part on executing the second boot-up procedure.

* * * * *